(12) United States Patent
Zuo (10) Patent No.: US 12,489,094 B2
(45) Date of Patent: Dec. 2, 2025

(54) PACKAGE STRUCTURE AND METHOD FOR FABRICATING SAME

(71) Applicant: CHANGXIN MEMORY TECHNOLOGIES, INC., Hefei (CN)

(72) Inventor: Mingxing Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 440 days.

(21) Appl. No.: 18/150,208

(22) Filed: Jan. 5, 2023

(65) Prior Publication Data

US 2024/0047437 A1 Feb. 8, 2024

(30) Foreign Application Priority Data

Aug. 3, 2022 (CN) .......................... 202210928901.1

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4842* (2013.01); *H01L 21/4853* (2013.01); *H01L 23/49541* (2013.01); *H01L 23/49811* (2013.01); *H01L 23/5386* (2013.01); *H01L 24/05* (2013.01); *H01L 24/43* (2013.01); *H01L 24/45* (2013.01); *H01L 24/48* (2013.01); *H01L 24/85* (2013.01); *H01L 25/50* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/43* (2013.01);
(Continued)

(58) Field of Classification Search
CPC .................. H01L 2225/0651; H01L 24/46
See application file for complete search history.

(56) References Cited

U.S. PATENT DOCUMENTS

2020/0075548 A1* 3/2020 Kim ....................... H01L 24/16

FOREIGN PATENT DOCUMENTS

CN 105023901 A 11/2015

* cited by examiner

*Primary Examiner* — Yu-Hsi D Sun
(74) *Attorney, Agent, or Firm* — Kilpatrick Townsend & Stockton LLP (57) ABSTRACT

Embodiments relate to the field of semiconductors, and provide a package structure and a method for fabricating the same. The package structure includes: a stack including a plurality of semiconductor devices stacked; a plurality of electrical connection portions positioned on a same side of the stack, each of the electrical connection portions being electrically connected to a corresponding semiconductor device, wherein in a direction distant from the stack, heights of different electrical connection portions gradually increase; and a plurality of wires electrically connected to each of the electrical connection portions and a corresponding semiconductor device, wherein the higher a layer where one semiconductor device is positioned in the stack, the farther one electrical connection portion connected to this semiconductor device is away from the stack. At least yield and reliability of the package structure can be improved while satisfying development of miniaturization of the package structure.

9 Claims, 6 Drawing Sheets

(51) Int. Cl.
  *H01L 23/00* (2006.01)
  *H01L 23/495* (2006.01)
  *H01L 23/498* (2006.01)
  *H01L 23/538* (2006.01)
  *H01L 25/00* (2006.01)

(52) U.S. Cl.
  CPC ............... *H01L 2224/45124* (2013.01); *H01L 2224/45139* (2013.01); *H01L 2224/45144* (2013.01); *H01L 2224/45147* (2013.01); *H01L 2224/48229* (2013.01); *H01L 2224/85444* (2013.01); *H01L 2224/85447* (2013.01); *H01L 2224/85455* (2013.01)

PACKAGE STRUCTURE AND METHOD FOR FABRICATING SAME

CROSS-REFERENCE TO RELATED APPLICATION

This application claims priority to Chinese Patent Application No. 202210928901.1, titled "PACKAGE STRUCTURE AND METHOD FOR FABRICATING SAME" and filed to the State Patent Intellectual Property Office on Aug. 3, 2022, the entire contents of which are incorporated herein by reference.

TECHNICAL FIELD

Embodiments of the present disclosure relate to the field of semiconductors, and more particularly, to a package structure and a method for fabricating the same.

BACKGROUND

A package structure is a structure in which a semiconductor device is configured to serve as part of an electronic product. To meet requirements of the package structure for miniaturization and high integration, a concept of package-on-package is currently proposed. The package-on-package has a plurality of semiconductor devices stacked, which may meet the requirements of rapidly processing large-capacity data while having a smaller occupied area.

Generally, the package structure of the package-on-package includes a substrate and a plurality of semiconductor devices stacked on the substrate, and the semiconductor devices are electrically connected to the substrate by means of a wire bonding process, to implement electrical connection between the semiconductor devices and circuits in the substrate, and then implement signal transmission between the semiconductor devices and external circuits. In some embodiments, electrical connection points on the semiconductor devices electrically connected to bonding wires are defined as first solder joints, electrical connection points on the substrate electrically connected to the bonding wires are defined as second solder joints, and the first solder joints and the second solder joints are electrically connected by means of the bonding wires bent.

At present, the package structure still has problems that yield and reliability need to be improved and delay is higher.

SUMMARY

Embodiments of the present disclosure provide a package structure and a method for fabricating the same.

According to some embodiments of the present disclosure, one aspect of the embodiments of the present disclosure provides a package structure. The package structure includes: a stack including a plurality of semiconductor devices stacked; a plurality of electrical connection portions positioned on a same side of the stack, each of the electrical connection portions being electrically connected to a corresponding semiconductor device, wherein in a direction distant from the stack, heights of different electrical connection portions gradually increase; and a plurality of wires electrically connected to each of the electrical connection portions and a corresponding semiconductor device, wherein the higher a layer where one semiconductor device is positioned in the stack, the farther the electrical connection portion connected to this semiconductor device is away from the stack.

According to some embodiments of the present disclosure, another aspect of the embodiments of the present disclosure provides a method for fabricating the package structure. The method includes: providing a stack comprising a plurality of semiconductor devices stacked; forming a plurality of electrical connection portions, the plurality of electrical connection portions being positioned on a same side of the stack, and each of the plurality of electrical connection portions being electrically connected to a corresponding one of the plurality of semiconductor devices, wherein in a direction distant from the stack, heights of different ones of the plurality of electrical connection portions gradually increase; and forming a plurality of wires by means of a wire bonding process, the plurality of wires being electrically connected to each of the plurality of electrical connection portions and a corresponding one of the plurality of semiconductor devices, wherein the higher a layer where one semiconductor device is positioned in the stack, the farther the electrical connection portion connected to this semiconductor device is away from the stack.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, product yield and reliability of a package structure in the prior art are poor.

After analysis, it is found that one of the reasons for the poor yield and reliability of the package structure is as below. As number of layers of semiconductor devices increases, number and density of electrical connection portions (i.e., second solder joints) connected to the semiconductor devices also need to increase accordingly, and generally, top heights of different electrical connection portions are the same. An action space of forming wires by means of a wire bonding process is limited, especially when the adjacent electrical connection portions have different electrical properties. To prevent the wires connected to the adjacent electrical connection portions from colliding, a larger operating space is required, which makes the wire bonding process more difficult. In addition, because the heights of top surfaces of the different electrical connection portions are consistent, a height difference of different wires is correspondingly smaller, which leads to easy collision between the different wires, and adversely affects the yield of the package structure. Especially when the different wires have different electrical properties, collision between the different wires may cause failure or even scrap of the package structure. In addition, the collision between the different wires may also easily cause deterioration of positional stability of the wires, such as deterioration of stability of connection between the wires and the electrical connection portions, which may also have an adverse effect on the yield and reliability of the package structure. Moreover, the consistent heights of the different electrical connection portions may also cause a larger difference in lengths of the different wires, resulting in a delay.

The embodiments of the present disclosure provide a package structure, the plurality of electrical connection portions are positioned on the same side of the stack, and each electrical connection portion is electrically connected to a semiconductor device of the stack. In a direction distant from the stack, heights of different electrical connection portions gradually increase. Each of the plurality of wires is electrically connected to one electrical connection portion and the corresponding semiconductor device. The higher a layer where one semiconductor device is positioned in the stack, the farther the corresponding electrical connection portion is away from the stack. In this way, there is a height difference between ends of different wires in contact with the electrical connection portions, such that the problem of collision between the wires corresponding to the semiconductor devices in adjacent layers may be avoided, thereby avoiding the problem of interference between the different wires. For example, undesirable electrical connection between the different wires may be avoided, and the problem of position squeezing between the different wires may also be avoided, thereby improving the yield and the reliability of the package structure. In addition, in the embodiments of the present disclosure, by arranging the electrical connection portions having increasing heights, an operating space required for arranging the wires is reduced, which may ensure that the different electrical connection portions are arranged more closely, thereby further reducing a plane view size of the package structure. In addition, the height difference between the different electrical connection portions can reduce a length difference between the different wires, thereby reducing the time delay.

To make the objectives, technical solutions and advantages of the embodiments of the present disclosure more clear, the embodiments of the present disclosure will be described in detail below with reference to the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

FIGS. 1 to 4 are schematic structural diagrams of a package structure according to one embodiment of the present disclosure.

Figure 1:
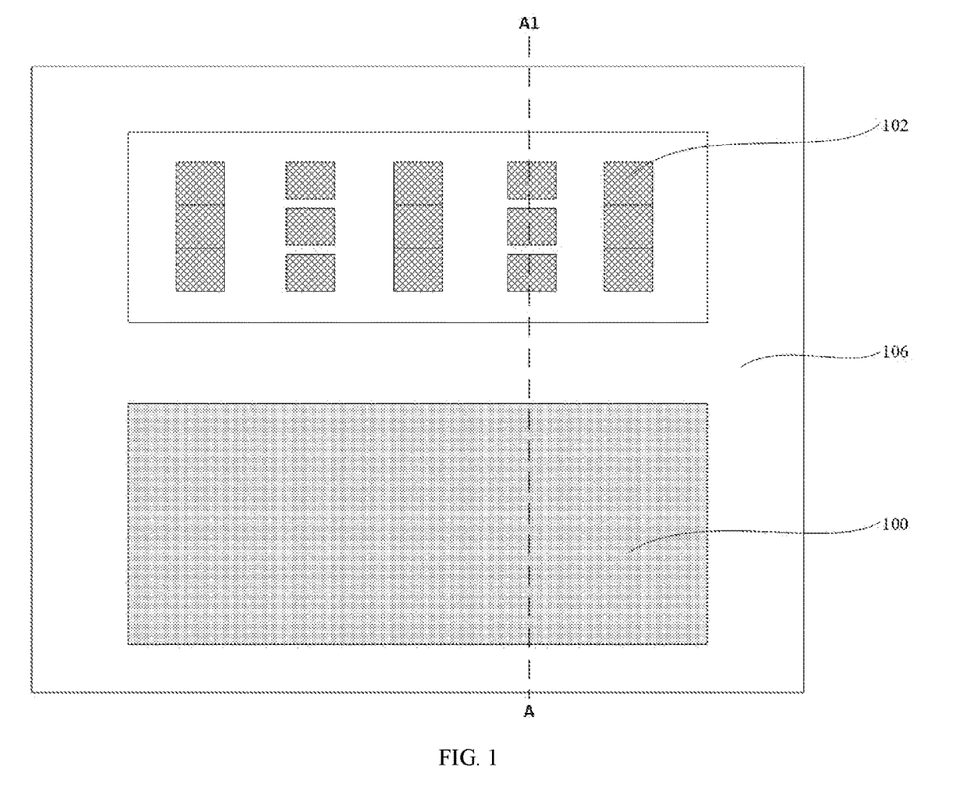
FIG. 1 is a schematic structural vertical view of a package structure according to an embodiment of the present disclosure.
Figure 2:
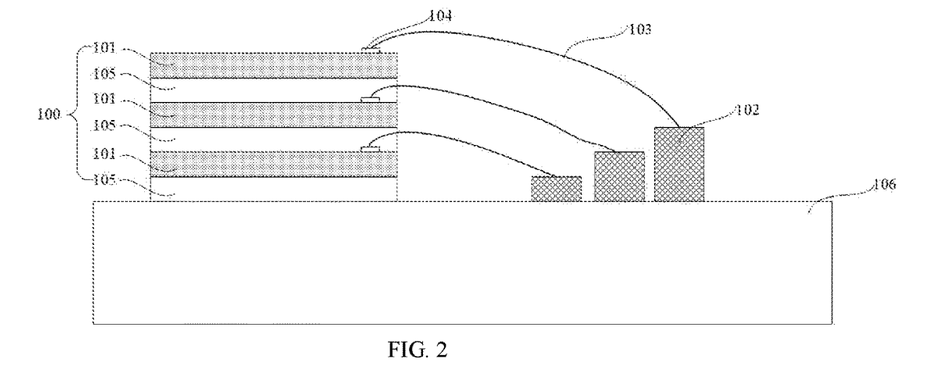
FIG. 2 is a schematic cross-sectional structural diagram of the package structure according to an embodiment of the present disclosure.
Figure 3:
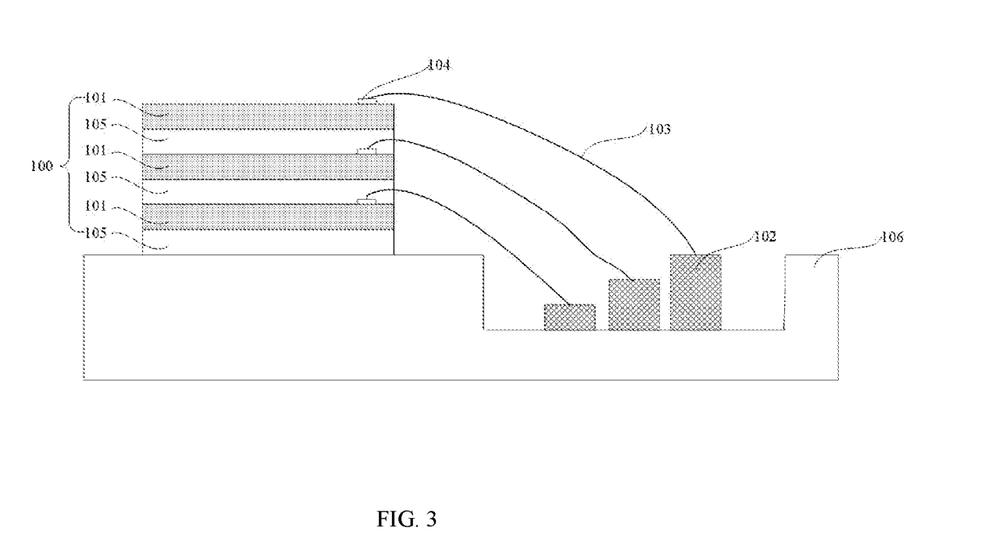
FIG. 3 is another schematic cross-sectional structural diagram of the package structure according to an embodiment of the present disclosure.
Figure 4:
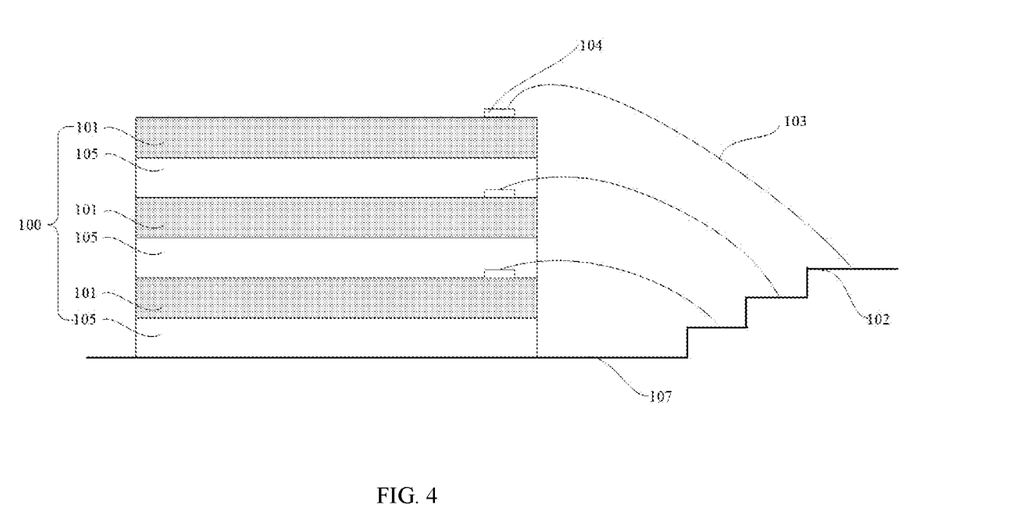
FIG. 4 is yet another schematic cross-sectional structural diagram of the package structure according to an embodiment of the present disclosure.

FIG. 1 is a schematic structural vertical view of a package structure according to an embodiment of the present disclosure; FIG. 2 is a schematic cross-sectional structural diagram cut along a direction AA1 in FIG. 1; FIG. 3 is another schematic cross-sectional structural diagram cut along the direction AA1 in FIG. 1; and FIG. 4 is a schematic cross-sectional structural diagram of another package structure according to an embodiment of the present disclosure.

Referring to FIG. 1 to FIG. 4, the package structure includes: a stack 100 including a plurality of semiconductor devices 101 stacked; a plurality of electrical connection portions 102 positioned on a same side of the stack 100, each of the electrical connection portions 102 being electrically connected to a corresponding semiconductor device 101, where in a direction distant from the stack 100, heights of different electrical connection portions 102 gradually increase; and a plurality of wires 103 electrically connected to each of the electrical connection portions 102 and a corresponding semiconductor device 101, where the higher a layer where one semiconductor device 101 is positioned in the stack 100, the farther the electrical connection portion 102 connected to this semiconductor device 101 is away from the stack 100.

By arranging the above package structure, there is a height difference between ends of different wires 103 in contact with the electrical connection portions 102, such that the problem of collision between the wires 103 corresponding to the semiconductor devices 101 in adjacent layers may be avoided, thereby avoiding the problem of interference between the different wires 103. For example, undesirable electrical connection between the different wires 103 may be avoided, and the problem of position squeezing between the different wires may also be avoided, thereby improving the yield and the reliability of the package structure. In addition, in the embodiments of the present disclosure, by arranging the electrical connection portions 102 having increasing heights, an operating space required for arranging the wires 103 is reduced, which may ensure that the different electrical connection portions 102 are arranged more closely, thereby further reducing the plane view size of the package structure. In addition, in the embodiments of the present disclosure, by arranging the electrical connection portions having increasing heights, the difference in lengths of the different wires may be reduced, thereby reducing the time delay.

The embodiments of the present disclosure will be described in detail below with reference to the accompanying drawings. It should be noted that, for convenience of illustration, the wires 103 are not shown in FIG. 1.

The stack 100 may include at least two layers of semiconductor devices 101 stacked, for example, may include 4 layers, 6 layers, 10 layers, 20 layers, and the like. In some embodiments, the semiconductor devices 101 may be chips, and the plurality of semiconductor devices 101 in the stack 100 may be the same type of chips, for example, may be memory semiconductor chips. Each of the memory semiconductor chips may be, for example, a volatile memory semiconductor chip, which may be a dynamic random access memory (DRAM) or a static random access memory (SRAM). A non-volatile memory semiconductor chip may be a phase-change random access memory (PRAM), a magnetoresistive random access memory (MRAM), a ferroelectric random access memory (FeRAM) or a resistive random access memory (RRAM). The semiconductor device 101 may also be a flash memory, e.g., a Not AND (NAND) flash memory.

In addition, the plurality of semiconductor devices 101 in the stack 100 may also include different types of semiconductor chips. For example, some of the plurality of semiconductor devices 101 may be logic chips, and other semiconductor chips may be memory chips. For example, each of the logic chips may be a central processing unit (CPU) chip, a graphics processing unit (GPU) chip, or an application processor (AP) chip.

Referring to FIG. 2, a positional relationship between the plurality of semiconductor devices 101 in the stack 100 may be that the plurality of semiconductor devices 101 are stacked up and down. Side surfaces of the plurality of semiconductor devices 101 stacked may all be kept flush, or may not be kept flush and are partially stagger.

The semiconductor device 101 includes a chip, and the semiconductor device 101 further includes pads 104 exposed from the chip, where one end of the wire 103 is electrically connected to the pads 104, and each of the pads 104 is configured to electrically connect a circuit in the semiconductor device 101. Pads 104 may protrude from the surfaces of the semiconductor devices 101, and the surfaces of the pads 104 may also be flush with the surfaces of the semiconductor devices 101. The first pads 104 are generally arranged on edge surfaces of the semiconductor devices 101.

Materials of the pads 104 may include copper (Cu), nickel (Ni), aluminum (Al), silver (Ag), gold (Au), or a combination thereof. Referring to FIG. 2, the positions of the pads 104 may be positioned on side edges of the semiconductor devices 101 close to the electrical connection portions 102.

In some embodiments, the stack 100 may further include bonding layers 105 positioned between the semiconductor devices 101 in adjacent layers and configured to adhere the adjacent semiconductor devices 101.

The bonding layers 105 may be die attach films (DAFs). In other embodiments, the bonding layers 105 may not be provided, the semiconductor devices 101 in the adjacent layers are in contact, and the stack 100 may be formed by means of electrostatic bonding or chemical bonding.

In some embodiments, referring to FIG. 2, the electrical connection portions 102 may be conductive pillars 102, and correspondingly, the package structure may further include a substrate 106, on which the stack 100 and the conductive pillars 102 are all positioned.

Materials of the conductive pillars 102 may be at least one of copper (Cu), nickel (Ni) or gold (Au).

The heights of the electrical connection portions 102 gradually increase in a direction distant from the stack. It is to be understood that, in this case, the heights of the electrical connection portions 102 serving as the conductive pillars depend on number of metal layers electroplated in the conductive pillars. The higher the heights of the electrical connection portions 102 are, the more metal layers are electroplated on the electrical connection portions 102; and the lower the heights of the electrical connection portions 102 are, the fewer metal layers are electroplated on the electrical connection portions 102. In some embodiments, the metal layers electroplated in one electrical connection portion 102 may include: one or more copper layers, one or more nickel layers, and one or more gold layers. The nickel layers are positioned above the copper layers, and the gold layers are positioned at the top of the entire electrical connection portion 102. In this way, the gold layers having high oxidation resistance may protect the electrical connection portions from being corroded. In this case, the copper layers, the nickel layers and the gold layers jointly constitute the entire electrical connection portion 102, and the height of the electrical connection portion 102 is jointly determined by the number the copper layers, the nickel layers and the gold layers.

The substrate 106 may be a printed circuit board (PCB). The substrate 106 may be a rigid PCB or a flexible PCB. The electrical connection portions 102 may be positioned on the surface of the substrate 106. In some embodiments, the electrical connection portions 102 may be electrically connected to the circuits in the substrate 106, such that the semiconductor devices 101 are electrically connected to the circuits in the substrate 106 by means of the electrical connection portions 102. In some other embodiments, the substrate 106 may also be a wafer carrier, the substrate 106 may serve as a carrier for carrying the electrical connection portions 102 and the stack 100, and the substrate 106 may not be provided with circuits.

The number and positional arrangement of the electrical connection portions 102 are related to the number of the semiconductor devices 101 and the distribution positions of the pads 104 in the semiconductor devices 101. FIG. 1 only shows that the electrical connection portions 102 are arranged on the sides of the semiconductor devices 101, and there are a plurality of columns of the electrical connection portions 102. The electrical connection portions 102 in each column are electrically connected to the pads 104 in the semiconductor devices 101 in the corresponding layer. That is, a plurality of pads 104 may be provided on the side edges of the semiconductor devices 101.

In addition, the plurality of electrical connection portions 102 electrically connected to the semiconductor devices 101 in the different layers may be spaced apart from each other. That is, the electrical properties of the plurality of electrical connection portions 102 may be different. The electrical properties refer to different electrical signals received by the different electrical connection portions 102. The plurality of electrical connection portions 102 electrically connected to the semiconductor devices 101 in the different layers may also be of a continuous structure. That is, the plurality of electrical connection portions 102 may also be an integrated structure, and the electrical properties of the plurality of electrical connection portions 102 are the same. It is to be understood that, according to the electrical properties of the different electrical connection portions 102, the positional relationship between the different electrical connection portions 102 may be reasonably set.

In some embodiments, referring to FIG. 1, among at least part of the electrical connection portions 102, the electrical connection portions 102 having different heights are spaced apart from each other. When the electrical connection portions 102 having the different heights receive electrical signals of different electrical properties, to prevent the electrical signals of different properties from being short-circuited and enable normal operation of the package structure, the electrical connection portions 102 having the different heights should be spaced apart from each other. Among at least part of the electrical connection portions 102, the electrical connection portions 102 having the different heights may be connected to each other. When the electrical connection portions 102 having the different heights are connected to the electrical signals of the same property, no matter whether the electrical connection portions 102 having the different heights are short-circuited at this moment, the transmission of the electrical signals is not adversely affected, and the normal operation of the package structure is not adversely affected. Therefore, the electrical connection portions 102 having the different heights do not need to be spaced apart from each other in this case, and the electrical connection portions 102 having the different heights are connected to each other.

In some embodiments, referring to FIG. 2, the substrate 106 may have no groove, and the electrical connection portions 102 are all positioned on the surface of the substrate and on the same side of the stack 100. In this case, the heights of the electrical connection portions gradually increase along the direction distant from the stack 100, such that there is a height difference between the ends of the different wires 103 in contact with the electrical connection portions 102, and thus the problem of collision between the wires 103 corresponding to the semiconductor devices 101 in the adjacent layers may be avoided. In addition, because the heights of the electrical connection portions 102 increase, vertical distances between the pads 104 on the semiconductor devices 101 and the top surfaces of the electrical connection portions 102 decrease, and the length difference of the wires 103 connected to the pads 104 and the electrical connection portions 102 also decreases accordingly, such that the time delay caused by the length difference of the wires 103 may be reduced.

In some other embodiments, referring to FIG. 3, a groove is provided on a surface of the substrate 106 facing the stack 100, and at least part of the plurality of electrical connection portions 102 close to the stack 100 are positioned at a bottom of the groove. The arrangement of the groove may further reduce the size of the package structure and meet the development of miniaturization of the package structure. In addition, the electrical connection portions 102 are arranged in the groove, which is beneficial to provide a longitudinal (i.e., perpendicular to the surface of the substrate 106) process window for the electrical connection portions having a greater height, and is further beneficial to provide a layout space to increase the height difference of the tops of the adjacent electrical connection portions 102. In addition, it is also beneficial to further increase a wiring length of the wires 103 and reduce wiring difficulty of the wires 103.

In some embodiments, the plurality of electrical connection portions 102 are all positioned at the bottom of the groove, and top surfaces of the at least part of the plurality of electrical connection portions 102 are lower than a surface of the substrate 106. It is to be understood that, in some other embodiments, the top surfaces of part of the electrical connection portions 102 distant from the stack 100 may be higher than or flush with the surface of the substrate 106. In addition, in some other embodiments, part of the electrical connection portions 102 may be positioned at the bottom of the groove, and part of the electrical connection portions 102 distant from the stack 100 may be positioned on the surface of the substrate 106. In this case, among the electrical connection portions 102 positioned at the bottom of the groove, the top surfaces of at least part of the electrical connection portions 102 close to the stack 100 are lower than the surface of the substrate 106, and a height relationship between the top surfaces of all the electrical connection portions 102 still satisfies a fact that the heights of the top surfaces of all the electrical connection portions 102 gradually increase along the direction distant from the stack 100. That is, the top surfaces of part of the electrical connection portions 102 positioned on the surface of the substrate 106 must be higher than the top surfaces of the electrical connection portions 102 positioned at the bottom of the groove.

FIG. 4 is yet another schematic cross-sectional structural diagram of the package structure according to an embodiment of the present disclosure.

Referring to FIG. 4, in some other embodiments, the plurality of electrical connection portions 102 may also be lead frames 107. The lead frames 107 include a plurality of steps, and each step corresponds to one electrical connection portion 102. The arrangement of the steps may make the heights of the different electrical connection portions 102 gradually increase along the direction distant from the stack 100, such that the problem of collision between the wires 103 corresponding to the semiconductor devices 101 in the adjacent layers may be avoided, thereby avoiding the problem of interference between the different wires 103. Meanwhile, the electrical connection portions having gradually increasing heights along the direction of the stack are provided by means of the steps, such that the vertical distances between the pads 104 on the semiconductor devices 101 and the top surfaces of the electrical connection portions 102 decrease, the length difference between the wires 103 connecting the pads 104 to the electrical connection portions 102 also decreases accordingly, and thus the time delay caused by the length difference of the wires 103 may be reduced.

Materials of the lead frames 107 may be at least one of an iron (Fe)-nickel (Ni) alloy or a copper (Cu)-based alloy.

The lead frame 107 also includes flat portions, which are positioned on sides of the plurality of steps, where the stack 100 is positioned on surfaces of the flat portions. The flat portions of the lead frames 107 are configured to place the stack 100, and the flat portions and the steps are matched with each other to form the complete package structure.

In some embodiments, the wires 103 may be at least one of silver alloy bonding wires, copper wires, aluminum wires, or gold wires.

In the package structure provided by the embodiments of the present disclosure, the plurality of electrical connection portions 102 are positioned on the same side of the stack 100, and each electrical connection portion 102 is electrically connected to a semiconductor device 101 of the stack 100. In a direction distant from the stack 100, the heights of different electrical connection portions 102 gradually increase. Each of the plurality of wires 103 is electrically connected to one electrical connection portion 102 and the corresponding semiconductor device 101. The higher a layer where one semiconductor device 101 is positioned in the stack 100, the farther the corresponding electrical connection portion 102 is away from the stack 100. In this way, there is a height difference between ends of different wires 103 103 in contact with the electrical connection portions 102, such that the problem of collision between the wires 103 corresponding to the semiconductor devices 101 in adjacent layers may be avoided, thereby avoiding the problem of interference between the different wires 103. For example, undesirable electrical connection between the different wires 103 may be avoided, and the problem of position squeezing between the different wires 103 may also be avoided, thereby improving the yield and the reliability of the package structure. In addition, there is a height difference between the ends of the different wires in contact with the electrical connection portions, which may reduce a length difference of the different wires, thereby reducing the delay. In addition, in the embodiments of the present disclosure, by arranging the electrical connection portions 102 having increasing heights, an operating space required for arranging the wires 103 is reduced, which may ensure that the different electrical connection portions 102 are arranged more closely, thereby further reducing the plane view size of the package structure.

The embodiments of the present disclosure further provide a method for fabricating a package structure, which may be configured to form the above package structure. The following will describe the method for fabricating the package structure provided in another embodiment of the present disclosure with reference to the accompanying drawings. For the same or corresponding parts, reference may be made to the corresponding descriptions of the above embodiments, which will not be repeated below. FIG. 5 to FIG. 11 are schematic structural diagrams corresponding to steps of a method for fabricating a package structure according to one embodiment of the present disclosure.

Figure 5:
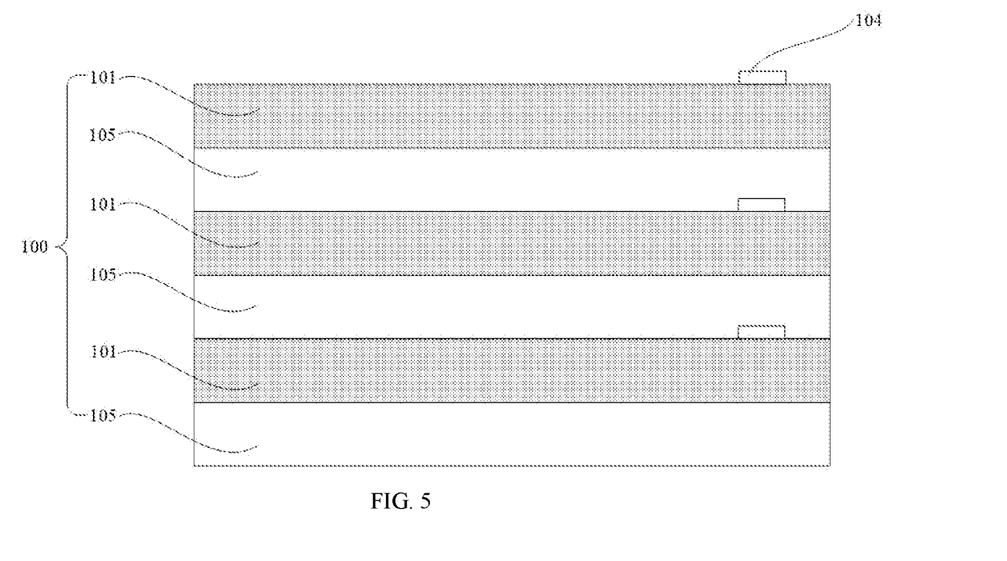
FIGS. 5 to 11 are schematic structural diagrams corresponding to steps of a method for fabricating the package structure according to an embodiment of the present disclosure.
Figure 6:
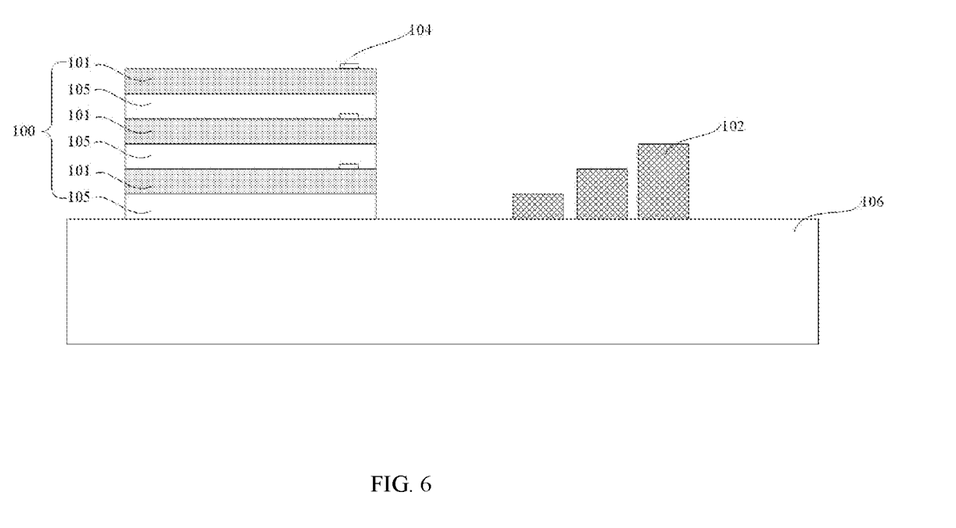
Figure 7:
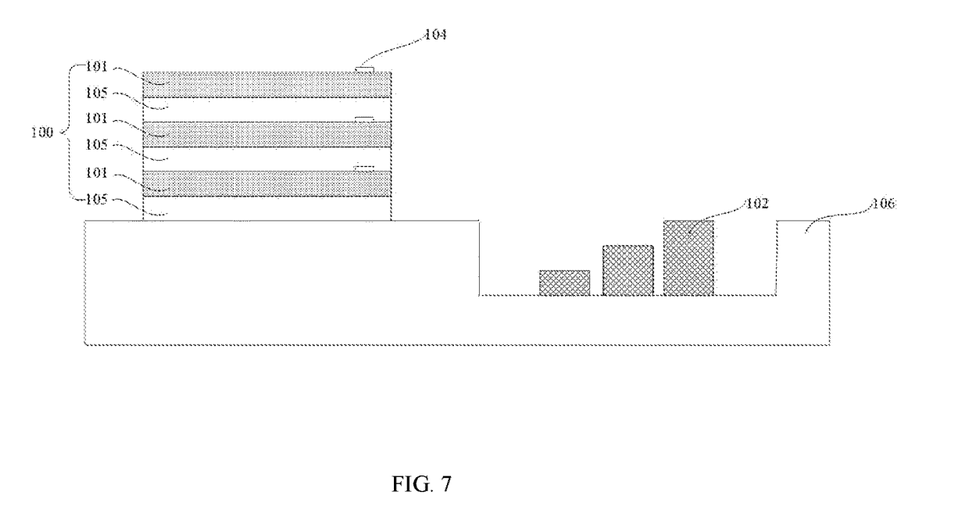

Referring to FIGS. 5 to 7, a stack 100 is provided, where the stack 100 includes a plurality of semiconductor devices 101 stacked; a plurality of electrical connection portions 102 are formed, where the plurality of electrical connection portions 102 are positioned on the same side of the stack 100, and each of the plurality of electrical connection portions 102 is electrically connected to a corresponding semiconductor device 101. In a direction distant from the stack 100, the heights of different electrical connection portions 102 gradually increase.

In some embodiments, referring to FIG. 6, the process step of providing the stack 100 and forming the plurality of electrical connection portions 102 include: providing a substrate 106, bonding the stack 100 on the substrate 106; and forming a plurality of conductive pillars on the substrate 106, where the conductive pillars are the electrical connection portion 102. In some embodiments, a manner of placing the stack 100 on the substrate 106 may be either electrostatic bonding or chemical bonding.

In some embodiments, the groove may not be provided on the surface of the substrate 106. Referring to FIG. 6, all the electrical connection portions 102 are formed on the surface of the substrate 106.

In other embodiments, referring to FIG. 7, before forming the plurality of conductive pillars, the method further comprises: forming the groove in the substrate 106; and in the process step of forming the plurality of conductive pillars, forming, at a bottom of the groove, at least part of the plurality of conductive pillars close to the stack 100.

For example, in the process step of forming the plurality of conductive pillars, the plurality of electrical connection portions 102 are all positioned at the bottom of the groove, and the top surfaces of at least part of the electrical connection portions 102 are lower than the surface of the substrate 106. In some other embodiments, in the process step of forming the plurality of conductive pillars, part of the electrical connection portions 102 close to the stack 100 are positioned at the bottom of the groove, other part of the electrical connection portions 102 distant from the stack 100 are positioned on the surface of the substrate 106, and the top surfaces of at least part of the electrical connection portions 102 positioned at the bottom of the groove are lower than the surface of the substrate 106.

Figure 8:
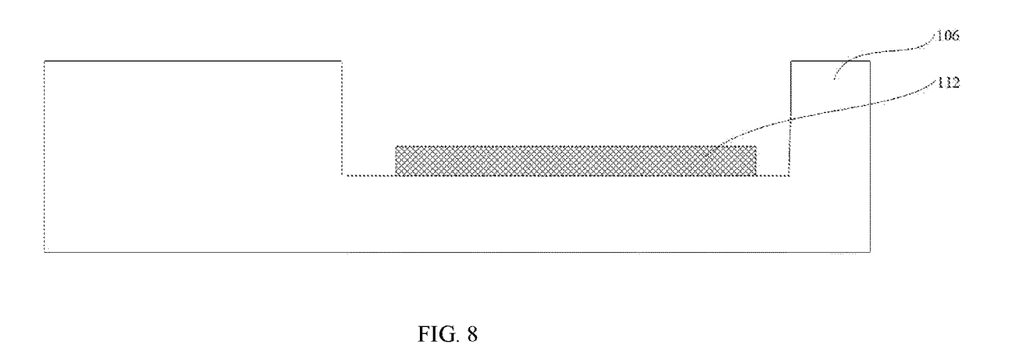
Figure 9:
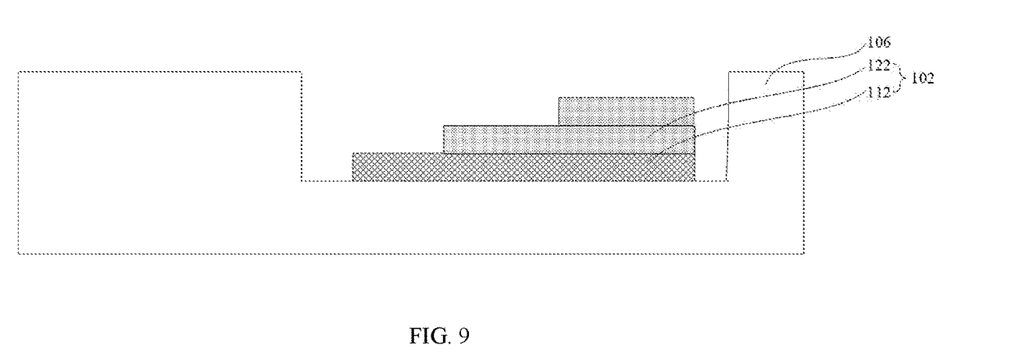

Referring to FIG. 8 and FIG. 9, the forming the plurality of conductive pillars may include: forming first conductive layers 112 on the substrate 106, where the first conductive layers 112 includes a plurality of electrical connection regions corresponding to different semiconductor devices 101; and forming second conductive layers 122 having different thicknesses respectively in different electrical connection regions, where the first conductive layer 112 and the second conductive layers 122 constitute the plurality of conductive pillars. The electrical connection portions 102 having a gradually increasing height in the direction distant from the stack 100 may be fabricated by means of such a multi-layer stacking mode.

The first conductive layer 112 may be made of copper, and the second conductive layers may be made of at least one of copper, nickel, and gold. Gold has strong oxidation resistance and thereof may protect the internal circuits from being corroded.

The second conductive layers 122 having different thicknesses may be formed by means of an electroplating process for multiple times; and before the electroplating, a mask layer is formed, and the mask layer covers part of the electrical connection regions without requiring the electroplating.

Before or after the second conductive layers 122 are formed, the method may further include: etching the first conductive layer 112 to separate the first conductive layers 112 in the adjacent electrical connection regions. The purpose of this step is that when the electrical connection portions 102 having the different heights are connected to the electrical signals of different properties, to prevent the electrical signals of different properties from being short-circuited and enable normal operation of the package structure, the different electrical connection portions 102 should be spaced apart from each other.

In some embodiments, the process of fabricating the electrical connection portions 102 may be as follows: firstly, the first conductive layer 112 and the second conductive layers 122 are formed by means of the electroplating process, and then the first conductive layer 112 and the second conductive layers 122 are etched together to obtain the plurality of electrical connection portions 102 having the different heights. In addition, in some other embodiments, the process of fabricating the electrical connection portions 102 may also be as follows: firstly, the first conductive layer 112 is formed by means of the electroplating process, then the first conductive layer 112 is etched to obtain the first conductive layers 112 separated, and the second conductive layers 122 are formed directly in surface regions of the first conductive layers 112 by means of the electroplating process with a mask.

In addition, the above mode for forming the electrical connection portions 102 having the different heights may be as follows: each electrical connection region is configured to form the electrical connection portions having the different heights, and firstly, the first conductive layers 112 are formed by means of the electroplating process at positions corresponding to all the electrical connection regions, and then the second conductive layers 122 are formed by means of the electroplating process at corresponding positions of the electrical connection regions where the electrical connection portions having relatively large heights are positioned. In some other embodiments, the first conductive layers may be formed by means of the electroplating process at the corresponding positions of the electrical connection regions where the electrical connection portions having the relatively large heights are positioned, and then the second conductive layers 122 may be formed by means of the electroplating process in all the electrical connection regions. In this way, it is ensured that the top heights of the electrical connection portions 102 formed correspondingly in the different electrical connection regions are different.

Figure 10:
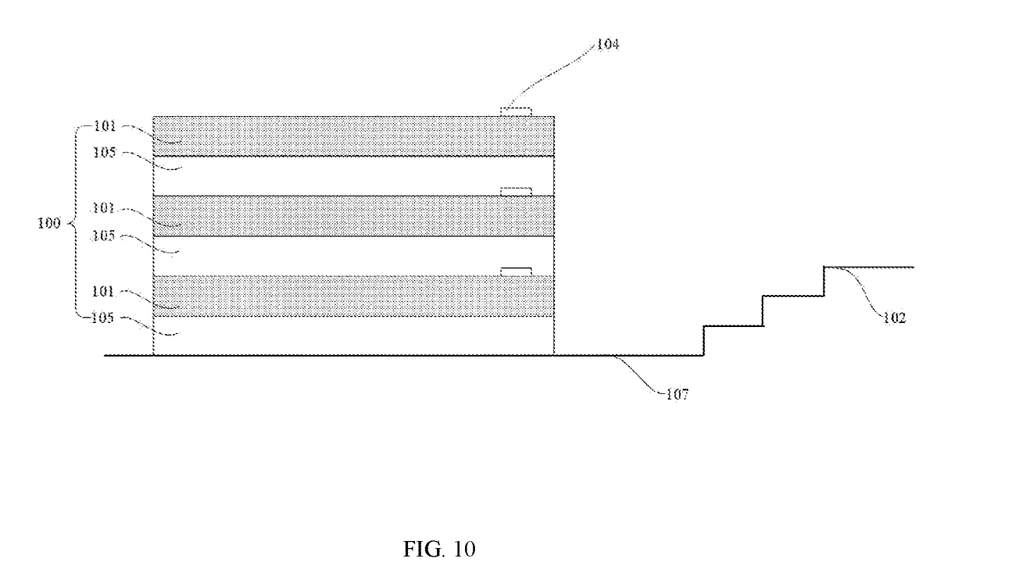

In some other embodiments, referring to FIG. 10, the process step of providing the stack 100 and forming the plurality of electrical connection portions 102 may include: providing lead frames 107, where the lead frames 107 include a plurality of steps, and each of the plurality of steps correspond to one electrical connection portion 102. The lead frames 107 further include flat portions, where the flat portions are positioned on sides of the plurality of steps, and the stack 100 is positioned on surfaces of the flat portions.

Figure 11:
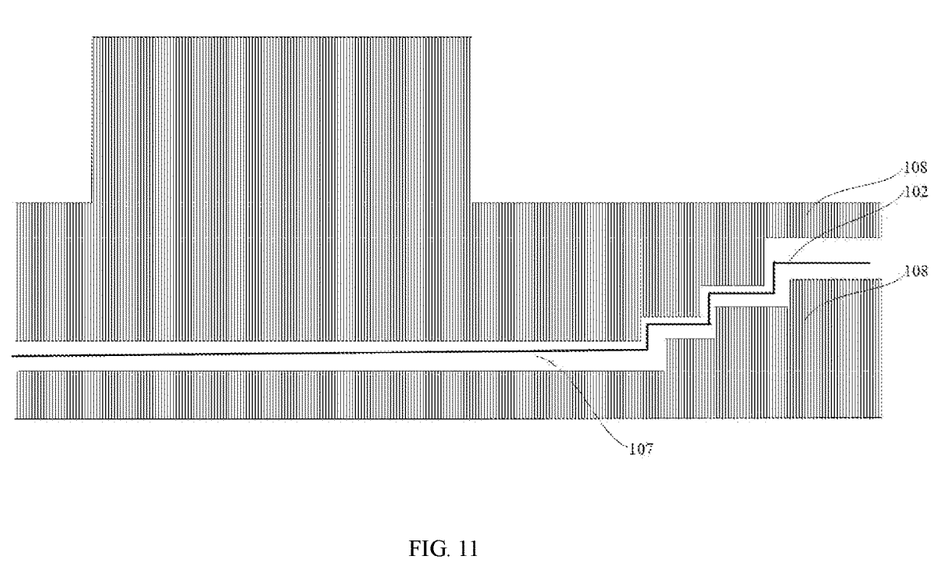

Referring to FIG. 11, the process step of forming the lead frames 107 comprises: providing initial lead frames; and stamping the initial lead frames by means of a mold 108 to deform the initial lead frames, where the deformed lead frames are the lead frames 107.

Referring to FIGS. 2 to 4, a plurality of wires 103 are formed by means of a wire bonding process, the plurality of wires 103 are electrically connected to each of the plurality of electrical connection portions 102 and a corresponding semiconductor device 101. The higher a layer where one semiconductor device 101 is positioned in the stack 100, the farther the electrical connection portion 102 connected to this semiconductor device 101 is away from the stack 100.

The higher the layer where the semiconductor device 101 is positioned in the stack 100, the farther the corresponding electrical connection portion 102 is away from the stack 100. In this way, there is a height difference between ends of different wires 103 103 in contact with the electrical connection portions 102, such that the problem of collision between the wires 103 corresponding to the semiconductor devices 101 in adjacent layers may be avoided, thereby avoiding the problem of interference between the different wires 103. For example, undesirable electrical connection between the different wires 103 may be avoided, and the problem of position squeezing between the different wires 103 may also be avoided, thereby improving the yield and the reliability of the package structure. In addition, there is a height difference between the ends of the different wires in contact with the electrical connection portions, which may reduce a length difference of the different wires, thereby reducing the time delay. In addition, in the embodiments of the present disclosure, by arranging the electrical connection portions 102 having increasing heights, an operating space required for arranging the wires 103 is reduced, which may ensure that the different electrical connection portions 102 are arranged more closely, thereby further reducing the plane view size of the package structure.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A package structure, comprising:
    a stack comprising a plurality of semiconductor devices stacked;
    a plurality of electrical connection portions positioned on a same side of the stack, each of the plurality of electrical connection portions being electrically connected to a corresponding one of the plurality of semiconductor devices, wherein in a direction distant from the stack, heights of different ones of the plurality of electrical connection portions gradually increase, the plurality of electrical connection portions are conductive pillars; and
    a plurality of wires, each of the plurality of wires being electrically connected to each of the plurality of electrical connection portions and a corresponding one of the plurality of semiconductor devices, wherein higher a layer where a given one of the plurality of semiconductor devices is positioned in the stack, farther a corresponding one of the plurality of electrical connection portions connected to the given semiconductor device is away from the stack;
    a substrate, the stack and the conductive pillars being all positioned on the substrate; wherein a groove is provided on a surface of the substrate facing the stack, and at least part of the plurality of electrical connection portions close to the stack are positioned at a bottom of the groove.

2. The package structure according to claim 1, wherein the plurality of electrical connection portions are all positioned at the bottom of the groove, and top surfaces of the at least part of the plurality of electrical connection portions are lower than the surface of the substrate.

3. The package structure according to claim 1, wherein among the at least part of the plurality of electrical connection portions, the electrical connection portions having different heights are spaced apart from one another.

4. The package structure according to claim 1, wherein the plurality of semiconductor devices comprise chips, and the plurality of semiconductor devices further comprise pads exposed from the chips, ends of the plurality of wires being electrically connected to the pads.

5. A method for fabricating a package structure, comprising:
    providing a stack, the stack comprising a plurality of semiconductor devices stacked;
    forming a plurality of electrical connection portions, the plurality of electrical connection portions being positioned on a same side of the stack, and each of the plurality of electrical connection portions being electrically connected to a corresponding one of the plurality of semiconductor devices, wherein in a direction distant from the stack, heights of different ones of the plurality of electrical connection portions gradually increase; and
    forming a plurality of wires by means of a wire bonding process, the plurality of wires being electrically connected to each of the plurality of electrical connection portions and a corresponding one of the plurality of semiconductor devices, wherein higher a layer where a given one of the plurality of semiconductor devices is positioned in the stack, farther a corresponding one of the plurality of electrical connection portions connected to the given semiconductor device is away from the stack;
    wherein the providing the stack and forming the plurality of electrical connection portions comprises:
    providing a substrate, the stack being bonded on the substrate; and
    forming a plurality of conductive pillars on the substrate, the plurality of conductive pillars being the plurality of electrical connection portions;
    wherein before forming the plurality of conductive pillars, the method further comprises: forming a groove in the substrate; and during the forming the plurality of conductive pillars, forming, at a bottom of the groove, at least part of the plurality of conductive pillars close to the stack.

6. The method according to claim 5, wherein during the forming the plurality of conductive pillars, the plurality of electrical connection portions are all positioned at the bottom of the groove, and top surfaces of the at least part of the plurality of electrical connection portions are lower than a surface of the substrate.

7. The method according to claim 5, wherein the forming the plurality of conductive pillars comprises:

forming first conductive layers on the substrate, the first conductive layers comprising a plurality of electrical connection regions corresponding to different ones of the plurality of semiconductor devices; and forming second conductive layers having different thicknesses respectively in different ones of the plurality of electrical connection regions, the first conductive layer and the second conductive layers constituting the plurality of conductive pillars.

8. The method according to claim 7, wherein the second conductive layers having the different thicknesses are formed by means of an electroplating process for multiple times; and before the electroplating, a mask layer is formed, the mask layer covering part of the plurality of electrical connection regions without requiring the electroplating.

9. The method according to claim 7, wherein before or after forming the second conductive layers, the method further comprises: etching the first conductive layer to separate the first conductive layers in adjacent two of the plurality of electrical connection regions.

* * * * *